（12）United States Patent
Spartiotis et al.

(10) Patent No.: US 6,410,922 B1
(45) Date of Patent: Jun. 25, 2002

(54) FORMING CONTACTS ON SEMICONDUCTOR SUBSTRATES FOR RADIATION DETECTORS AND IMAGING DEVICES

(76) Inventors: Konstantinos Evangelos Spartiotis, c/o Simage Oy, Tekniikantie 12, Fin-02150 Espoo (FI); Hannele Heikkinen, Juhannustie 10-12 D1, Fin-02200 Espoo (FI)

( * ) Notice: Subject to any disclaimer, the term of this patent is extended or adjusted under 35 U.S.C. 154(b) by 0 days.

(21) Appl. No.: 09/362,195

(22) Filed: Jul. 28, 1999

Related U.S. Application Data

(63) Continuation-in-part of application No. 08/755,826, filed on Nov. 26, 1996, now Pat. No. 6,046,068.

(30) Foreign Application Priority Data

Jul. 13, 1999 (GB) .............................. 9916404

(51) Int. Cl.$^7$ .............................. H01L 21/28
(52) U.S. Cl. .............................. 250/370.09; 250/370.13
(58) Field of Search ...................... 250/370.09, 370.13, 250/332

(56) References Cited

U.S. PATENT DOCUMENTS

| 5,130,259 | A | * | 7/1992 | Bahraman ...................... 437/5 |
| 5,648,674 | A | * | 7/1997 | Weisfield et al. ........... 257/428 |
| 5,888,892 | A | | 3/1999 | Toshiharu |
| 6,046,068 | A | * | 4/2000 | Orava et al. .................. 438/57 |
| 6,215,123 | B1 | * | 4/2001 | Orava et al. ........... 250/370.13 |

FOREIGN PATENT DOCUMENTS

| EP | 0 182 977 | | 6/1986 |
| EP | 0 200 082 | | 12/1986 |
| EP | 0 278 408 | | 8/1988 |
| EP | 0 415 541 | A1 | 3/1991 |
| GB | 2 027 556 | | 2/1980 |
| GB | 2 205 684 | | 12/1988 |
| JP | 2 232978 | A | 9/1990 |
| JP | 8 32101 | A | 2/1996 |
| WO | WO 97 20342 | A1 | 6/1997 |

OTHER PUBLICATIONS

International Search Report for Simage Oy Application Serial No. PCT/EP 00/06014, filed Jun. 28, 2000.

* cited by examiner

*Primary Examiner*—Constantine Hannaher
*Assistant Examiner*—Otilia Gabor (57) ABSTRACT

A method, suitable for forming metal contacts 31 on a semiconductor substrate 1 at positions for defining radiation detector cells, includes the steps of forming one or more layers of material 11,12 on a surface of the substrate with openings 23 to the substrate surface at the contact positions; forming a layer of metal 24 over the layer(s) of material and the openings; and removing metal at 28 overlying the layer(s) of material to separate individual contacts. Optionally, a passivation layer 11 to be left between individual contacts on the substrate surface, may be applied during the method. A method according to the invention prevents etchants used for removing unwanted gold (or other contact matter) coming into contact with the surface of the substrate (e.g. CdZnTe) and causing degradation of the resistive properties of that substrate. The product of the method and uses thereof are also described.

30 Claims, 4 Drawing Sheets

FORMING CONTACTS ON SEMICONDUCTOR SUBSTRATES FOR RADIATION DETECTORS AND IMAGING DEVICES

CROSS REFERENCE TO RELATED APPLICATIONS

This application is a continuation-in-part application of U.S. Application Ser. No. 08/755,826, filed on Nov. 26, 1996, now U.S. Pat. No. 6,046,068.

The invention relates to methods of manufacturing radiation detectors and radiation imaging devices, radiation detectors and imaging devices manufactured by these methods and the use of such imaging devices.

A typical method of manufacturing a radiation detector for an imaging device comprises applying a layer of a metal such as aluminium to both of the main surfaces of a planar semiconductor substrate, applying a layer of pbotoresistive material to cover the semiconductor material, exposing the photoresistive material on the surface of the planar substrate with an appropriate mask pattern, removing the photoresistive material to expose a pattern of the metal to be removed, etching away the metal to be removed and then removing the remaining photoresistive material to leave a pattern of contacts on one surface of the substrate and a metallised layer on the other surface of the substrate. The contacts on the first surface of the substrate then define an arrangement of radiation detector cells.

For optical wavelengths and charged radiation (beta-rays), silicon has typically been used for the semiconductor material for the substrate. A method of the type described above has been used to good effect with this material.

In recent years, cadmium zinc telluride (CdZnTe) has increasingly been proposed as a more suitable semiconductor material for use in X-ray, gamma-ray and to a lesser extent beta-ray, radiation imaging. CdZnTe is good at absorbing X-rays and gamma-rays giving better than 90% efficiency for 100 keV X-rays and gamma-rays with a 2 mm thick detector. The leakage or dark current of these detectors can be controlled and values of the order of 10 $nA/cm^2$ or less at 100 Volts bias are achievable.

A small number of companies worldwide currently produce these detectors commercially in a variety of sizes and thicknesses. Usually one or both sides of the planar detectors are contacted with a continuous metal layer such as gold (Au) or platinum (Pt). As mentioned above, such detector substrates then need to be processed to produce a detector having a pattern of contacts (e.g. pixel pads) on one surface, with the opposite surface remaining uniformly metallized, in order that the detector may be position sensitive, that is in order that the detector is able to produce a detector output indicating the position at which radiation impacts the detector. A readout chip then can be 'flip-chip' joined to the patterned side of the CdZnTe detector (e.g., by bump bonding using balls of indium or conductive polymer material, gluing using one-way conductive materials or other conductive adhesive layer techniques) so that the position dependent electrical signals which result from incidence and absorption in the detector cells of X-rays or gamma-rays can be processed. The readout chip could be of the pulse counting type with very fast integration and processing time (typical a few microseconds or at most a few milliseconds). Alternatively, it may be one of type described in the Applicant's International Patent Application PCT/EP 95/02056 which provides for charge accumulation for individual detector cells. With art imaging device as described in PCT/EP 95/02056, integration times can be several milliseconds, or tens or hundreds of milliseconds. As the signal integration or standby/readout period increases it becomes more critical that the gold or platinum contacts on the CdZnTe surface are electrically separated to a high degree to avoid signals from neighbouring contacts (pixel pads) leaking and causing the contrast resolution to degrade.

It has been found that the traditional method of forming the contacts on the detector surface, particularly when CdZnTe is used as the semiconductor material, does not provide as high an electrical separation of the contacts as would be desired to make optimum use of the advantages which are to be derived from the imaging devices as described in the International Application PCT/EP 95/02056, which is incorporated herein by reference.

In accordance with one aspect of the invention, there is provided a method of manufacturing a radiation detector having conductive contacts on a semiconductor substrate at positions for defining radiation detector cells, wherein said method includes steps of.:

a) forming one or more layers of material on a surface of said substrate with openings to said substrate surface at said contact positions;

a(i) forming a layer of passivation material on said substrate surface;

a(ii) forming a layer of photoresistive material on said passivation layer;

a(iii) selectively exposing said photoresistive material and removing said photoresistive material from areas corresponding to said contact positions to expose said passivation layers;

a(iv) removing said passivation material from said areas exposed in step a(iii) corresponding to said contact positions to expose said substrate surfaces;

a(v) removing remaining photoresistive material of said photoresistive material layer;

a(vi) forming a further layer of photoresistive material on said exposed passivation layer and exposed substrate surfaces; and     a(vii) selectively exposing said further layer of photoresistive material and removing said further photoresistive material in a pattern corresponding to said contact positions;

b) forming a layer of conductive material over said layer(s) of material and said openings; and c) removing conductive material overlying said layer(s) of material to separate individual contacts, including:

c(i) removing said further layer of photoresist material.

The use of an insulating layer of passivation material means that after manufacture of the detector, the passivation material remains between the contacts protecting the semiconductor surface from environmental damage in use and further enhancing the electrical separation of the contacts.

The present inventors have found that the surface resistivity of cadmium-based substrates, for example a CdZnTe semiconductor substrate is degraded when the substrate is exposed to metal etchants suitable for removing gold and/or platinum. As a result of this, the electrical separation of the individual contacts which result from the conventional method of forming such contacts is not as good as would be expected from the properties of that material before treatment. By using a lift-off method in accordance with the invention, metal etchants need not be used, thus avoiding the damage which would result if the metal etchants came into contact with the semiconductor surface. By removing a first pbotoresistive layer and subsequently applying a further photoresistive layer improved adherence to the passivation material may be obtained. Moreover, the mechanical integrity of the further layer of photoresistive material is greater than the first layer, and consequently lift-off of subsequently formed layers of material, e.g conductive material, may be achieved more reliably and has been found to provide a higher production yield for devices manufactured using this process.

Furthermore, the further layer of photoresistive material allows for the exposure of areas larger than the contact positions such that conductive material may be applied over portions of passivation material adjacent to the contact positions. Further photoresistive material may even be applied to areas or regions away from, yet operatively related to, contact positions. This is particularly advantageous and is intended for use in manufacturing high energy (1 KeV) radiation imaging devices since it allows more complex conductive material patterns and/or second conductive material layers to be formed on the passivation material. For example, for off-setting a charge collection contact of a detector cell relative to a corresponding contact of a readout substrate cell. Additionally, conductive material may extend from the contact positions over adjacent portions of the passivation material, thereby providing good mechanical contact, and reducing the possibility of gaps being formed between the conductive material and passivation material.

In a preferred embodiment the further photoresistive material is removed from an area corresponding generally to said contact positions. Preferably, the further photoresistive material is removed from an area greater than said contact positions to expose adjacent portions of said passivation material. In this way, gaps between conductive material and passivation material can be avoided.

Optionally, the further photoresistive material is removed from areas of said passivation material to expose said areas in a desired pattern for forming conductive tracks.

To protect the other main surface and the sides (edges) of the semiconductor substrate, photoresistive material can additionally be applied to all exposed surfaces prior to step a(iv).

In a preferred method in accordance with the invention, prior to step a(iv), a photoresistive material is additionally applied to all exposed surfaces.

The invention finds particular, but not exclusive use with substrates formed of cadmium telluride (CdTe) or cadmium zinc telluride (CdZnTe). It will be appreciated that the method of the invention can be used with other substrate materials as well.

Typically, the conductive layer is a metal or metal alloy or cadmium sulfide.

Preferably, the metal layer for forming the contacts is applied by a method such as sputtering, evaporation or electrolytic deposition, preferably by sputtering.

Preferably, the metal layer for forming the contacts comprises gold (Au), although other metals, for example platinum (Pt) or indium (In), could also be used.

Preferably, the passivation layer is formed of aluminium nitride (ALN).

Each-metal contact can define a respective pixel cell of an array of pixel cells, or one of a plurality of strips arranged parallel to each other, depending on the application of the detector.

With a method according to the invention, the metal contacts can be of the order of 10 $\mu$m across with a spacing of the order of 5 $\mu$m.

The invention also provides a method of manufacturing a radiation detector, comprising a semiconductor substrate with a plurality of conductive contacts for respective radiation detector cells on a first surface thereof and layer of conductive material on a surface of the substrate opposite to the first surface, the conductive contacts being formed on the first surface by a method as described above. The layer of conductive material can be formed on the opposite surface of the substrate prior to step (a) of the method described above.

Suitably, the conductive material or contacts are of metal or metal alloys.

The invention further provides a method of manufacturing a radiation imaging device, comprising manufacturing a radiation detector as defined above, and individually connecting individual contacts for respective detector cells to corresponding circuits on a readout chip, for example by a flip-chip technique.

In accordance with another aspect of the invention, there is provided a radiation detector comprising a semiconductor substrate for detecting radiation with a plurality of conductive contacts for respective radiation detector cells on a first surface thereof and with a layer of conductive material on a second surface of said substrate opposite to said first surface, wherein the overall width of a said conductive contact is larger than the width of said contact adjacent said substrate.

In a preferred embodiment of the invention the semiconductor substrate is made of cadmium zinc telluride (CdZnTe), although other semiconductor substrate materials, for example cadmium telluride (CdTe), could be used. Preferably also passivation material is provided between individual contacts. Aluminium nitride has been found to be particularly effective as a passivation material for CdZnTe because it can be applied at low temperature, CdZnTe being temperature sensitive.

The metal contacts can define an array of pixel cells, or a plurality of strips arranged parallel to each other, depending on the field of use of the detector.

Pixel contacts formed on detector substrate are preferably substantially circular and are arranged in a plurality of rows, more preferably with alternate rows preferably being offset from adjacent rows.

The metal contacts are of the order of 10 $\mu$m across wit a spacing of the order of 5$\mu$m.

In detectors in accordance with the invention, the resistivity between metal contacts should be in excess of 1 G$\Omega$/square, preferably in excess of 10 G$\Omega$/square, more preferably in excess of 100 G$\Omega$/square and even more preferably in excess of 1000 G$\Omega$/square (1 T$\Omega$/square).

The invention also provides a radiation imaging device comprising a radiation detector as defined above and a readout chip having a circuit for accumulating charge from successive radiation hits, individual contacts for respective detector cells being connected by a flip-chip technique to respective circuits for accumulating charge.

A radiation imaging device in accordance with the invention finds particular application for X-ray, gamma-ray and beta-ray imaging.

Thus an embodiment of the invention can provide a method for manufacturing, for example, detectors having a CdZnTe substrate with one side uniformly metallised with gold and the other side patterned with gold structures in a manner that does not adversely affect the surface characteristics of the CdZnTe substrate between the gold structures. Thus, a method can be provided for creating gold structures on one side of a CdZnTe detector, the method achieving interstructure resistivity of the order of G$\Omega$/square or tens or hundreds of G$\Omega$/square. The gold structures may be patterned to provide readout tracks, for example.

The use of an electrically insulating passivation layer between contacts further enables the area between metal contacts to be protected, thus giving the detector stable performance over time and avoiding effects such as oxidation which increase the surface leakage current and decrease the inter-contact resistivity. Aluminium nitride (AlN) passivation has been found to be particularly effective when applied between gold contacts to protect the surface and enhance the electrical separation of the gold contacts. The passivation layer of aluminium nitride can be implemented at relatively low temperatures typically less than 100° C. By contrast, silicon oxide ($SiO_2$), which is typically used as a passivant for silicon (Si) semiconductors, needs temperatures in excess of 200° C. After exposure to these temperatures, CdZnTe would be unusable.

Embodiments and of the invention will be described hereinafter, by way of example only, with reference to the accompanying drawings in which.

FIG. 1 illustrates an example of a method in accordance with the invention of forming metal contacts on a semiconductor substrate at positions for defining radiation detector cells with a layer of passivation material between the detector cells. In this example it is assumed that the semiconductor substrate is made of cadmium zinc telluride (CdZnTe) or cadmium telluride (CdTe), although it will be appreciated that other semiconductor materials, for example lead iodide, thallium bromide gallium arsenide or silicon, can be used. Also, it will be assumed that the metal used for the metallisation layer and the contacts is gold, although it will be appreciated that other metals, alloys or other conductive materials, for example platinum or indium, could be used. In addition, it is assumed that the passivation material is aluminium nitride, although other materials could be used where compatibility with the substrate material is given.

Thus, FIG. 1 is a schematic cross-sectional view from the side of a detector substrate at various stages in the formation of gold contacts on a CdZnTe substrate.

Step A: The CdTe/CdZnTe detector substrate 1 has one face (the lower face in FIG. 1) uniformly metallised with gold 2.

Step B: Aluminium nitride 11 is sputtered on the bare face (the upper face in FIG. 1) of the CdTe/CdZnTe detector 1.

Step C: Photoresistive material (photoresist) 12 is spun on the passivation layer 11. The photoresist is any of the common materials used in photolithography, sensitive to certain light wavelengths for creating a pattern on it.

Step D: Openings 13 are made in the photoresist 12 using an appropriate mask or other conventional technique for removing photoresist according to a desired pattern.

Step E: Photoresist is also applied to the sides 14 of the detector to protect them from consequent steps.

Step F: Openings 15 are made though the passivation layer 11 using an aluminium nitride etchant to expose the CdTe/CdZnTe substrate Step G: The photoresist is removed from the upper face to expose the passivation layer at 22.

Step H: A second layer of photoresist 26 is applied over the passivation layer 22 and openings 23 to the upper side of the detector.

Step I: Openings 27 are made in the second layer of photoresist 26 utilising a mask or other suitable means to provide openings slightly larger than the openings 23 in the passivation layer 22.

Step J: Gold 28 is sputtered, evaporated or laid by electrolysis uniformly over the exposed passivation layer 22, the photoresist 26 and the openings 27 to the upper surface of the detector, as a result of which the gold layer 28 covers the photoresist, the exposed passivation material 22 and the CdTe/CdZnTe surface of the openings 23 in the passivation material 22.

Step K: Photoresist layer 26 is removed, suitably by dissolving with a solvent such as acetone, thereby lifting off unwanted gold areas 29 and to expose areas of passivation 30 disposed between electrodes 31. The electrodes 31 slightly overlap the passivation material 30 for ensuring that there are no gaps between the passivation material and the electrode material.

Step L: The second layer is thus removed revealing the gold contacts 31 and the passivation material 30 in the regions between the contacts 31. The photoresist layer 14 on the sides of the detector and lower face of the detector is also removed at this stage. No photoresist therefore remains on the CdTe/CdZnTe detector since it is usually hydroscopic material that in time would absorb humidity and deteriorate the detector performance.

With the foregoing method, the end result is a CdTe/CdZnTe detector with the lower face 2 uniformly metallised with gold and upper face metallised with gold in a desired pattern. The method ensures that at no step is there any need for gold etchant, nor that the aluminium nitride etchant come in contact with the regions 20 between the gold pixel contacts 21 or the edges and sides of the CdTe/CdZnTe detector. As a consequence, during the above procedure the surface of the substrate at 20 between the gold contacts 21 remains unharmed, retaining very high resistivity of the order of G$\Omega$/square, tens, hundreds or even thousands of G$\Omega$/square and very low surface leakage current.

As mentioned above, as high as possible resistivity between gold pixel pads is desired in order to allow long integration standby or headout times of the signal created from impinging X-rays and gamma-rays without deterioration of the image resolution.

The aluminum nitride passivation covers the area 20 between the metal contacts 21 protecting the corresponding regions form oxidation (providing stability over time) and enhancing the inter-contact resistivity.

With the above described method gold pixel pads 9 as small as 10 $\mu$m across with 5 $\mu$m spacing in between (i.e. 15 $\mu$m position sensitivity) can be readily obtained, while retaining very high inter pixel resistivity.

Variations of the above procedure may be applied without departing from the scope of the invention.

Figure 1A:
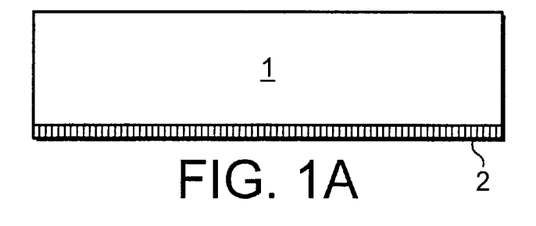
FIG. 1 is an example of a method of forming metal contacts on a semiconductor substrate with a passivation layer between contacts.
Figure 1B:
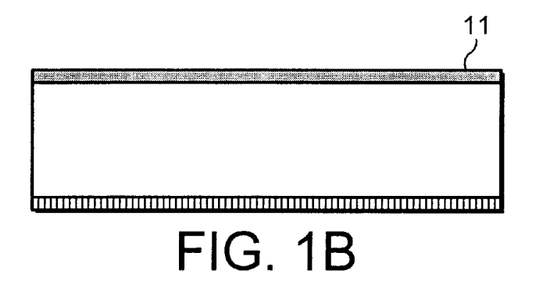
Figure 1C:
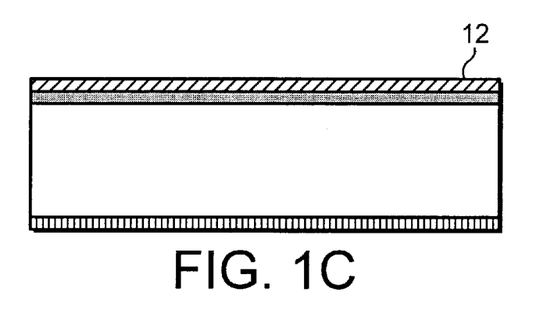
Figure 1D:
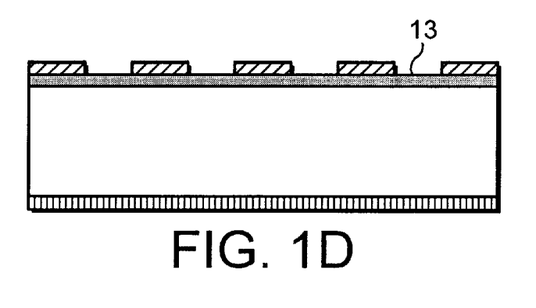
Figure 1E:
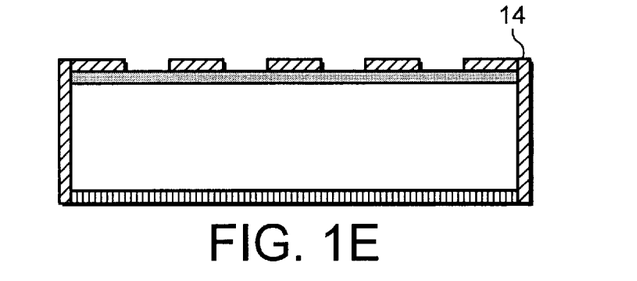
Figure 1F:
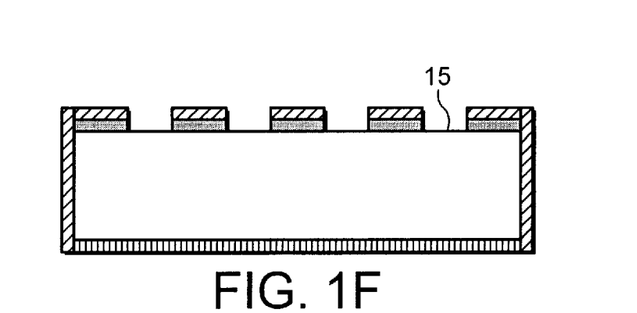
Figure 1G:
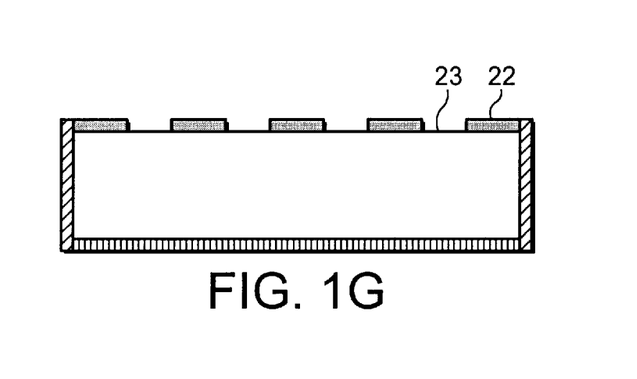
Figure 1H:
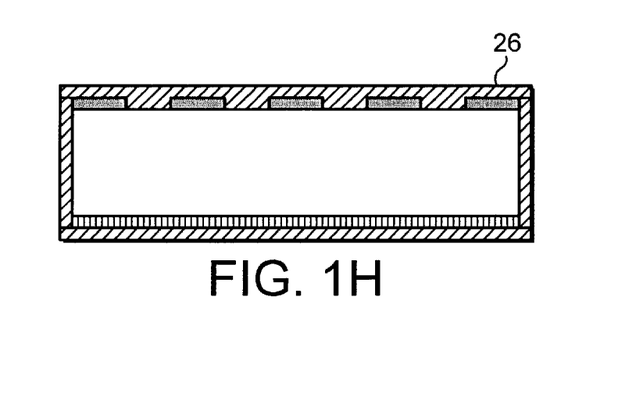
Figure 1I:
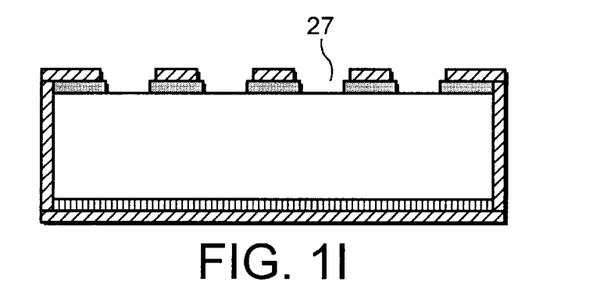
Figure 1J:
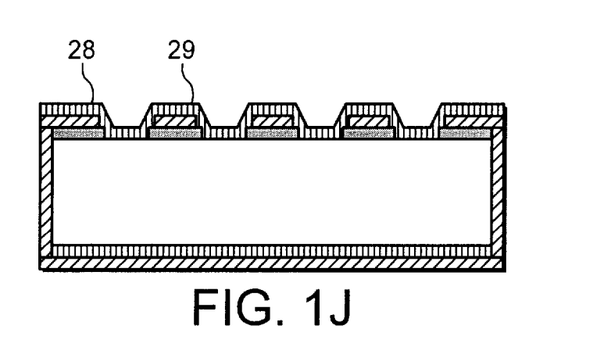
Figure 1K:
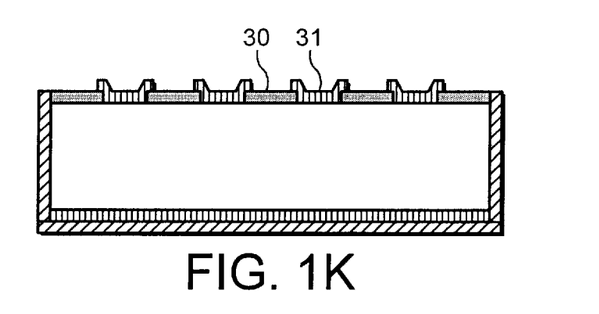
Figure 1L:
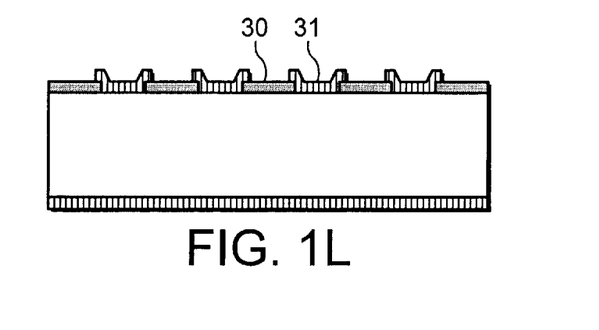
Figure 2:
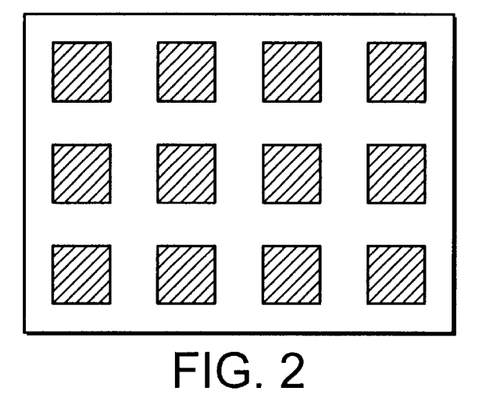
FIG. 2 is a schematic plan view of one contact configuration on a detector substrate.
Figure 3:
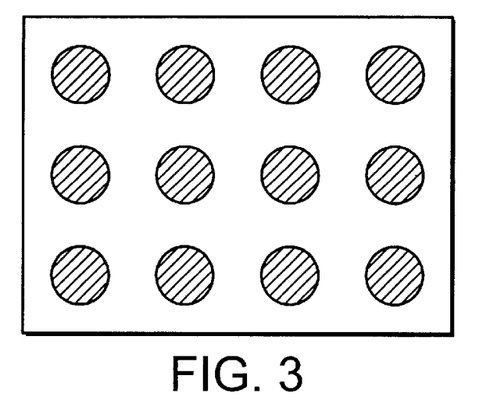
FIG. 3 is a schematic plan view of another contact configuration on a detector substrate.
Figure 4:
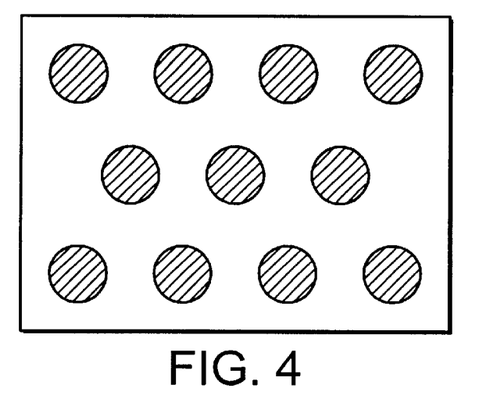
FIG. 4 is a schematic plan view of a further contact configuration on a detector substrate.

FIGS. 2, 3 and 4 are used to illustrate possible pixel contact patterns on the upper surface of the detector substrate. In FIG. 2, an array of square pixel contact pads is shown. In FIG. 3 an array of circular pixel pads is shown. The use of circular rather than square pixel pads increases the surface resistance between pads by increasing the amount of resistive material between adjacent pads. FIG. 4 illustrates an array of offset honeycombed) pixel pads. Once again this further increases the resistance between pads by increasing the surface amount of resistive material between adjacent pads.

It will be appreciated that rather than providing an array of contacts for defining an array of pixel detector cells, other contact configurations, for example contact strips for defining strip-shaped detector cells, can be obtained with the same method.

Although reference has been made to the use of gold for the contacts. gold is an advantageous material because it can be readily etched to define the desired contact structures and give good contact (better than aluminium, for example) to the CdZnTe, it is apparent that the procedure disclosed above could also be applied for any kind of conductive material or metal contacts (e.g. platinum, nickel, aluminium, nickel/gold alloy, platinum/gold alloy, titanium/tungsten or cadmium sulfide) in combination with an appropriate etchant.

As mentioned above, it should be noted that the longitudinal dimensions (width) of the top of the gold contacts is larger than that at the gold-substrate interface. This arises from the relative sizes of the openings to the substrate surface and the photoresist left over the portions for forming the contacts to ensure that, when redundant gold is etched away, the etchant will not seep through to the interface between first layer of photoresist (or the passivation layer) and gold in the openings.

A radiation imaging device can be constructed by connecting a radiation detector produced by the method according to one of the above described methods to a readout chip having circuits for accumulating charge from successive radiation hits, individual contacts (e.g. pixel pads) for respective detector cells being 'flip-chip' joined (e.g., by bump bonding using balls of indium or conductive polymer material, gluing using one-way conductive materials, or other conductive adhesive layer techniques) to respective circuits for accumulating charge.

Thus, the invention teaches how to obtain a radiation detector (e.g. based on a CdZnTe substrate) with one side metallised according to a desired pattern with maximum possible electrical resistivity separation between the metal contacts. High resistivity between metal contacts is desirable to improve contrast resolution and eliminate signal leakage between adjacent metal contacts on the substrate surface. This is particularly relevant when long charge accumulation times and long standby/readout ties are employed by the readout chip. Such accumulation and standby/readout tunes could, for example, be in excess of 1 msec in examples of imaging devices using a radiation detector manufactured in accordance with the present invention. Such imaging devices find application, for example, for X-ray, gamma-ray and beta-ray imaging as described in the applicant's International Patent Application PCT/EP 95/02056 incorporated herein by reference.

Although particular embodiments of the invention have been described by way of example, it will be appreciated that additions, modifications and alternatives thereto may be envisaged.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependent claims may be combined with those of the independent claims and features from respective independent claims may be combined in any appropriate manner and not merely in the specific combinations enumerated in the claims.

What is claimed is:

1. A method of manufacturing a radiation detector having conductive contacts on a semiconductor substrate at positions for defining radiation detector cells, wherein said method includes steps of:
   a) forming one or more layers of material on a surface of said substrate with openings to said substrate surface at said contact positions;
      a(i) forming a layer of passivation material on said substrate surface;
      a(ii) forming a layer of photoresistive material on said passivation layer;
      a(iii) selectively exposing said photoresistive material and removing said photoresistive material from areas corresponding to said contact positions to expose said passivation layers;
      a(iv) removing said passivation material from said areas exposed in step a(iii) corresponding to said contact positions to expose said substrate surfaces;
      a(v) removing remaining photoresistive material of said photoresistive material layer;
      a(vi) forming a further layer of photoresistive material on said exposed passivation layer and exposed substrate surfaces; and
      a(vii) selectively exposing said further layer of photoresistive material and removing said further photoresistive material in a pattern corresponding to said contact positions;
   b) forming a layer of conductive material over said layer(s) of material and said openings; and
   c) removing conductive material overlying said layer(s) of material to separate individual contacts, including:
      c(i) removing said further layer of photoresistive material.

2. A method according to claim 1, wherein in step a(vii) said further photoresistive material is removed from an area corresponding generally to said contact positions.

3. A method according to claim 1, wherein in step a(vii) said further photoresistive material is removed from areas of said passivation material to expose said areas in a desired pattern for forming conductive tracks.

4. A method according to claim 1 wherein in step a(vii) said further photoresistive material is removed from an area greater than said contact positions to expose adjacent portions of said passivation material.

5. A method according to claim 4, wherein adjacent portions of said passivation material are exposed in step a(vii) such that after removal of said conductive material in step c(i), said contacts cover said opening and also extend up and laterally beyond said opening.

6. A method according to claim 1, wherein, prior to step a(iv), a photoresistive material is additionally applied to all exposed surfaces.

7. A method according to claim 1, wherein the substrate is formed of cadmium zinc telluride or cadmium telluride.

8. A method according to claim 1, wherein said conductive material layer forming said contacts is applied by sputtering, evaporation, or electrolytic deposition.

9. A method according to claim 1, wherein said conductive material is a metal or metal alloy or cadmium sulfide.

10. A method according to claim 9, wherein said metal or metal alloy for forming said contacts comprises nickel, gold, platinum, indium, nickel/gold alloy, titanium/tungsten alloy or platinum/gold alloy.

11. A method according to claim 1, wherein said passivation layer is aluminum nitride.

12. A method according to claim 1, wherein each conductive contact defines a respective pixel cell of an array of pixel cells.

13. A method according to claim 12, wherein said conductive contacts are of the order of 10 $\mu$m across with a spacing of the order of 5 $\mu$m.

14. A method according to claim 1, wherein each conductive contact defines one of a plurality of strips arranged parallel to each other.

15. A method according to claim 1, wherein a plurality of said conductive contacts for respective radiation detector cells is formed on a first surface of said semiconductor substrate, and a layer of conductive material is formed on a surface of said substrate opposite to said first surface.

16. A method according to claim 15 including, prior to step (a), a step of forming said layer of conductive material on said second surface of said substrate.

17. A method of manufacturing a radiation imaging device comprising:

manufacturing a radiation detector in accordance with claim 16; and individually connecting individual detector cell contacts for respective detector cells to corresponding circuits on a readout chip by a flip-chip technique.

18. A radiation detector comprising a semiconductor substrate with a plurality of conductive contacts for respective radiation detector cells on a first surface thereof and a layer of conductive material on a surface of said substrate opposite to said first surface, said radiation detector being manufactured by a method in accordance with claim 16 and the overall width of a said conductive contact is larger than the width of said contact adjacent said substrate.

19. A method of manufacturing a radiation imaging device comprising:

manufacturing a radiation detector in accordance with claim 15; and individually connecting individual detector cell contacts for respective detector cells to corresponding circuits on a readout chip by a flip-chip technique.

20. A radiation detector comprising a semiconductor substrate with a plurality of conductive contacts for respective radiation detector cells on a first surface thereof and a layer of conductive material on a surface of said substrate opposite to said first surface, said radiation detector being manufactured by a method in accordance with claim 15 and the overall width of a said conductive contact is larger than the width of said contact adjacent said substrate.

21. A radiation detector according to claim 20, comprising passivation material between individual contacts.

22. A radiation detector according to claim 21, wherein said passivation material is aluminum nitride.

23. A radiation detector according to claim 20, wherein said conductive contacts define an array of pixel cells.

24. A radiation detector according to claim 23, wherein said contacts are substantially circular and are arranged in a plurality of rows, with alternate rows preferably being offset from adjacent rows.

25. A radiation detector according to claim 20, wherein said conductive contacts define a plurality of strips arranged parallel to each other.

26. A radiation detector according to claim 20, wherein said metal contacts are of the order of 10 $\mu$m across with a spacing of the order of 5 $\mu$m.

27. A radiation detector according to claim 20, wherein said semiconductor substrate is cadmium zinc telluride or cadmium telluride.

28. A radiation detector according to claim 20, wherein the resistivity between conductive contacts is in excess of 1 G$\Omega$/square, preferably in excess of 10 G$\Omega$/square, more preferably in excess of 100 G$\Omega$/square and even more preferably in excess of 1000 G$\Omega$/square (1 T$\Omega$/square).

29. A radiation imaging device comprising a radiation detector in accordance with claim 20, and a readout chip having circuits for accumulating charge from successive radiation hits, individual contacts for respective detector cells being connected by a flip-chip technique to respective circuits for accumulating charge.

30. Use of a radiation imaging device according to claim 29 for X-ray, gamma-ray and beta-ray imaging.

* * * * *

UNITED STATES PATENT AND TRADEMARK OFFICE
CERTIFICATE OF CORRECTION

PATENT NO. : 6,410,922 B1 Page 1 of 1
APPLICATION NO. : 09/362195
DATED : June 25, 2002
INVENTOR(S) : Konstantinos Evangelos Spartiotis et al.

It is certified that error appears in the above-identified patent and that said Letters Patent is hereby corrected as shown below:

In the Title Page: Under "(30)  Foreign Application Priority Data"
add the following additional priority:
--Nov. 29, 1995 [GB] United Kingdom 9524387.9--

Signed and Sealed this

Sixth Day of July, 2010

David J. Kappos
*Director of the United States Patent and Trademark Office*